United States Patent
Idesawa

Patent Number: 5,113,063
Date of Patent: May 12, 1992

[54] METHOD OF MONITORING FOCUSING CONDITION USING RATE OF CHANGE SIGNAL AT A BORDER IN A SEMICONDUCTOR IMAGE POSITION SENSITIVE DEVICE

[75] Inventor: Masanori Idesawa, Wako, Japan

[73] Assignee: Rikagaku Kenkyusho, Japan

[21] Appl. No.: 604,773

[22] Filed: Oct. 24, 1990

[30] Foreign Application Priority Data

Oct. 26, 1989 [JP] Japan ............... 1-279284

[51] Int. Cl.$^5$ .................. G01J 1/20; G01N 21/86
[52] U.S. Cl. .................. 250/201.4; 250/201.7; 250/561
[58] Field of Search ............ 250/201.2, 201.4, 201.7, 250/211 J, 234, 561

[56] References Cited

U.S. PATENT DOCUMENTS

| | | | |
|---|---|---|---|
| 4,445,029 | 4/1984 | Nagaoka et al. | 250/201.4 |
| 4,829,171 | 5/1989 | Katsumura | 250/201.4 |
| 4,990,771 | 2/1991 | Minoura et al. | 250/201.2 |

FOREIGN PATENT DOCUMENTS

| | | | |
|---|---|---|---|
| 0194008 | 11/1983 | Japan | 250/201.2 |
| 0170883 | 7/1989 | Japan | 250/206.1 |

Primary Examiner—David C. Nelms
Assistant Examiner—Michael Messinger
Attorney, Agent, or Firm—Brumbaugh, Graves, Donohue & Raymond

[57] ABSTRACT

Disclosed is a method of monitoring the state of focusing of an image on a semiconductor image position sensitive device of the type having a photosensitive layer, a resistance layer provided on the photosensitive layer and output terminals provided on the resistance layer. In this method, a bright spot image is moved across a border between a light-insensitive or non-sensitive zone and a light-sensitive zone. The rate of change in the level of an output signal obtained when the bright spot image is moved across the border is then detected. The degree of focusing of the bright spot image is then derived from the state of change in the level of the output signal.

2 Claims, 4 Drawing Sheets

METHOD OF MONITORING FOCUSING CONDITION USING RATE OF CHANGE SIGNAL AT A BORDER IN A SEMICONDUCTOR IMAGE POSITION SENSITIVE DEVICE

BACKGROUND OF THE INVENTION

1. Field of the Invention

The present invention relates to a method of monitoring focusing condition in a semiconductor image position sensitive device (hereinafter referred to as "PSD"). More particularly, the present invention relates to a monitoring method which is suitable for use in adjusting an imaging optical system of a bright spot image position detecting apparatus which makes use of a PSD of multiple output terminal type.

2. Description of the Related Art

Conventional image position detecting apparatus incorporating a non-scan type PSD has no means which would enable monitoring of the state of focusing of a bright spot on the image detecting surface of the PSD. Therefore, the PSD is arranged merely such that its image detecting surface is positioned at the calculated imaging plane in its design. Alternatively, the optimum imaging plane is detected by a suitable means such as a scan-type image sensor and the PSD is set such that its image detecting surface is positioned in alignment with the imaging plane detected by the image sensor. It has been therefore impossible to monitor the focusing condition under the conditions of actual use.

Thus, in the known image position detecting apparatus incorporating a PSD, it has been difficult to adjust the optical system towards the best focusing, due to lack of means for monitoring the imaging condition of a bright spot on the image detecting surface of the PSD.

SUMMARY OF THE INVENTION

Accordingly, an object of the present invention is to provide a method of monitoring the focusing condition on a PSD, thereby overcoming the above-described problem of the prior art.

To this end, according to the present invention, there is provided a method of monitoring the focusing condition of an image on an image position sensitive device of the type having a photosensitive layer, a resistance layer provided on the photosensitive layer and output terminals provided on the resistance layer, the method comprising: moving a bright spot image across a border between a light-insensitive or non-sensitive zone formed on the detection surface of the position sensitive device and the light-sensitive zone of the surface of the position sensitive device; and observing the rate of change in the level of the output signal caused when the bright spot moves across the border, whereby the focusing condition of the bright spot image is detected.

In general, the better the condition of focusing or imaging, the smaller the size of the bright spot image and the higher the luminance of the bright spot image. The photoelectric current produced by the PSD changes when the bright spot image is moved across the light-insensitive or non-sensitive zone. The amount of current change varies according to the quantity of light incident to such a zone. More specifically, a greater amount of change in the photoelectric current is obtained when the size of the bright spot image is small, i.e., when the focusing condition is better, since in such a case the light-insensitive or non-sensitive zone receives a greater quantity of light. In addition, the rate of change in the ratio between the light quantity received by one zone on one side of a terminal and the quantity of light received by the zone on the other side of the terminal becomes greater when the size of the bright spot image decreases. It is therefore possible to detect the focusing condition of the image by measuring the output current while moving the bright spot image across the light-insensitive or non-sensitive zone.

According to the invention, it is thus possible to obtain information concerning the focusing condition of bright spot as a change in the level of the output current. Therefore, the optical system can easily be adjusted to the best focusing state by changing the focusing condition of the optical system while the amount of change in the output current level is observed and setting the optical arrangement in such a state that provides the steepest gradient of change in the output current level.

The above and other objects, features and advantages of the present invention will become clear from the following description when the same is read in conjunction with the accompanying drawings.

DESCRIPTION OF THE PREFERRED EMBODIMENT

Figure 5:
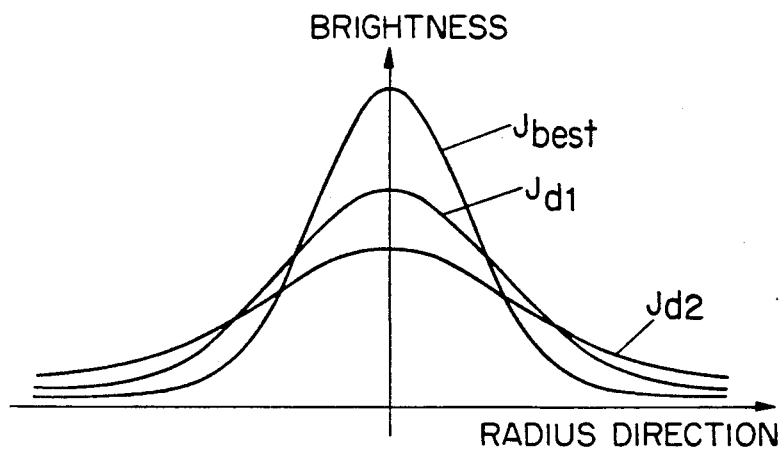
FIG. 5 is an illustration of different luminance distribution of bright spot image in different focusing condition.
Figure 6A:
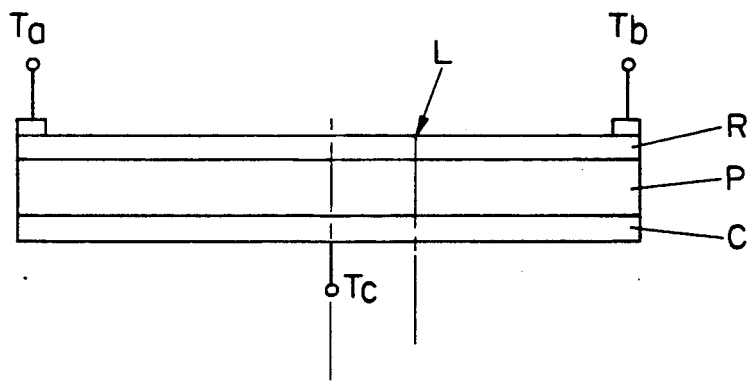
FIGS. 6A and 6B are illustrations of the concept of a conventional PSD.
Figure 6B:
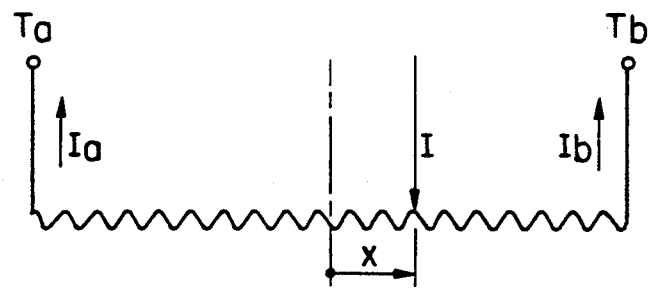

FIG. 6 A is an illustration showing the concept of an ordinary PSD, and FIG. 6B is a diagram showing a circuit equivalent to the PSD shown in FIG. 6A. The PSD has a resistance layer R, a photosensitive layer P and a bias layer C. When a light L impinges upon a portion of the PSD, an electric current flows between the resistance layer R and the bias layer C at the position where the light L is received. As a consequence, output currents Ia and Ib are obtained at output terminals Ta and Tb which are disposed on both ends of the resistance layer R. The light incident position X is then determined through a computation which is conducted on the basis of the resistance values between the position X and both output terminals which are proportional to the distances therebetween. In general, the luminance of a bright spot image optically focused on the PSD of the type described above has gaussian intensity distribution as shown in FIG. 5. In FIG. 5, a curve Jbest is the intensity distribution curve obtained under the best focusing state while $J_{d1}$ and $J_{d2}$ are intensity distribution curves which are obtained in out-of-focus states. The distribution of density of the current in the resistance layer also has a similar pattern of distribution. A better condition of focusing reduces the size of the bright spot image and enhances the luminance of the bright spot image. Conversely, a greater defocus amount makes the bright spot image ambiguous and large in size, while reducing the luminance. The levels of the detection output currents vary when a bright spot image having a certain luminance distribution moves across a border between a sensitive zone and non-sensitive zone of a PSD. A description will be given of the manner of change in the output currents.

Figure 1A:
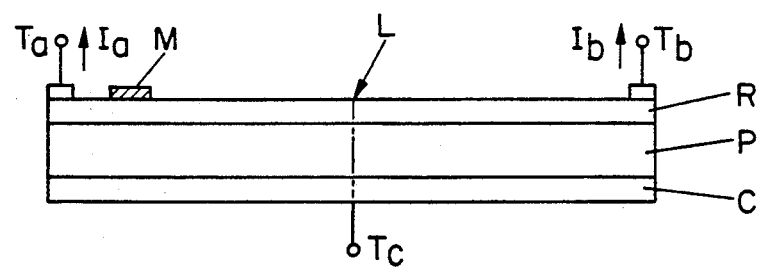
FIGS. 1A, 1B, 1C, and 1D are graphs showing changes in the output detection current of a semiconductor image position sensitive device as obtained when a bright spot is moved across a belt-like non-sensitive zone.
Figure 1B:
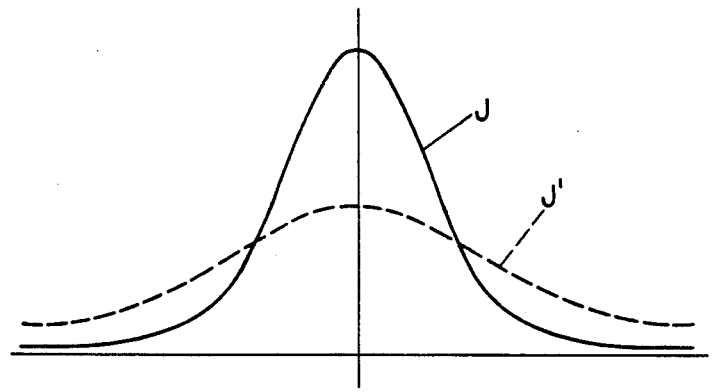
Figure 4:
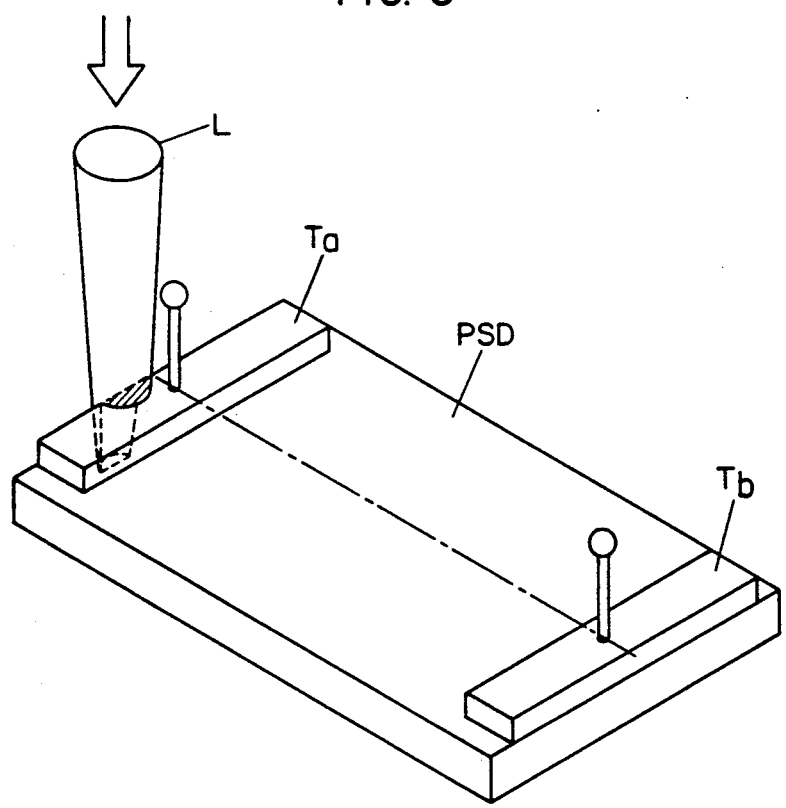
FIG. 4 is schematic illustration of a state in which a light beam is focused on an end portion of a PSD.

When a light beam is focused on one end of a PSD as shown in FIG. 4, a border is assumed such that the zone on one side of the border is sensitive to the light, while the zone on the other side of the border is non-sensitive. In such a case, the bright spot image exhibits a luminance distribution as shown in FIG. 1B, in which the curve J shows the best luminance distribution obtained under the best-focus state, while the curve J' shows the distribution obtained under out-of-focus state. Electric current introduced into the resistance layer exhibits a similar distribution. When the bright spot image having this luminance distribution moves across the non-sensitive zone such as the end of the PSD, the photoelectric current (Ia+Ib) obtained through the output terminals varies in a pattern which indicates the sharpness, i.e., the degree of focusing, as will be seen from a comparison between curves I and I' in FIG. 1C.

Figure 3:
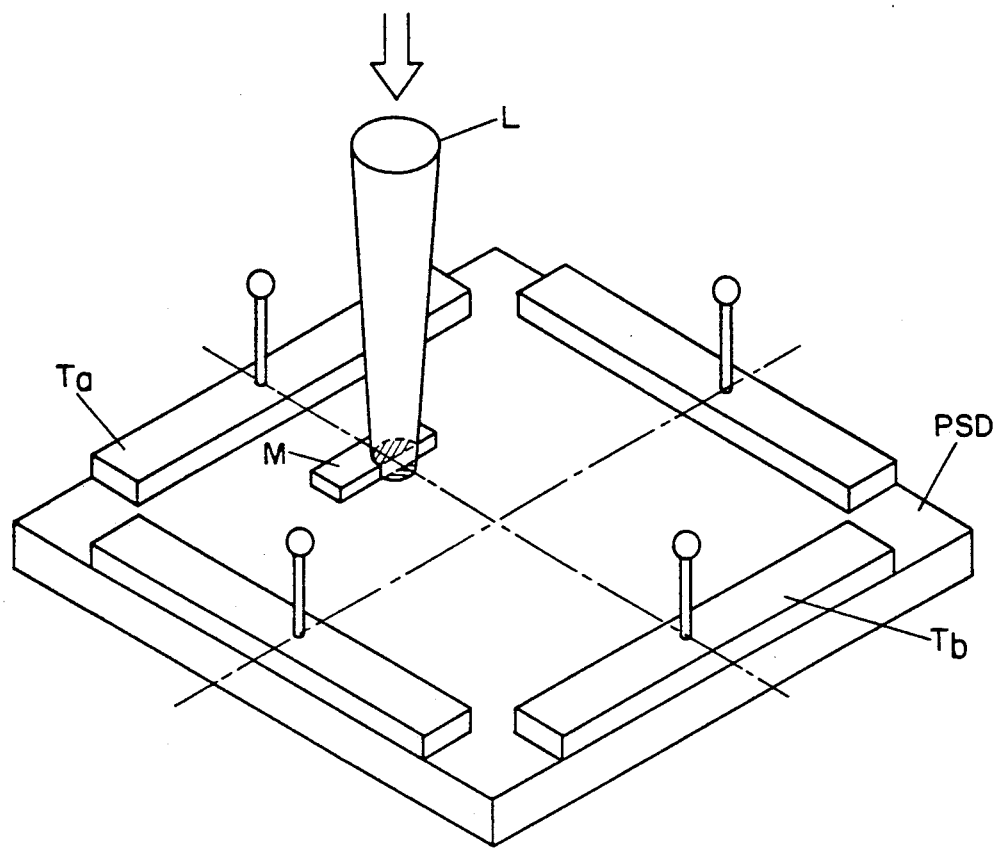
FIG. 3 is an illustration of a belt-like non-sensitive zone which is set on the photoelectric surface of a PSD.

Referring now to FIG. 3, a non-sensitive zone is formed by a belt-shaped mask M which is placed on the photosensitive surface of the PSD so as to interrupt the light. The mask M is shown in cross-section in FIG. 1A. In this case, the detection output current (Ia+Ib) varies in a manner shown by curves I and I' in FIG. 1D as the bright spot image moves across this non-sensitive zone. Thus, the state of focusing is reflected upon the pattern of change in the output current. It is therefore possible to detect the state of focusing by measuring the photoelectric output current while moving the bright spot image across a non-sensitive or light-insensitive zone on the detection surface of a semiconductor image position sensitive device. Using the result of the detected state of focusing, the focusing optical system can be adjusted to provide a better state of imaging.

Figure 2A:
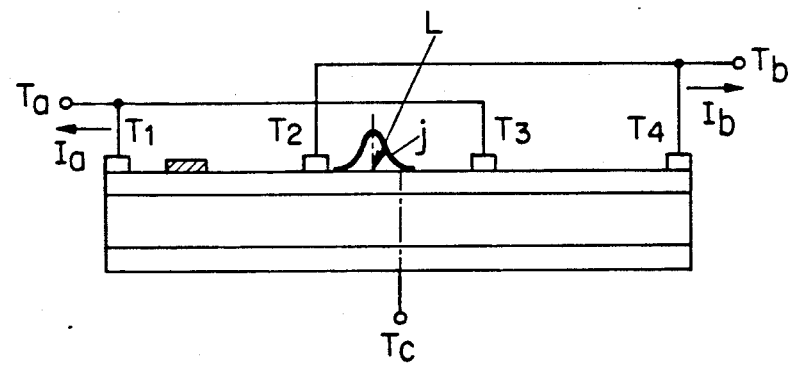
FIGS. 2A, 2B, 2C, and 2D are graphs showing changes in a computed image position signal and the gradient (differentiated value) of the signal as obtained when a bright spot image is moved across an auxiliary output terminal in a multiple output terminal type PSD.

FIG. 2A schematically shows a PSD of multiple output terminal type in which a plurality of auxiliary output terminals are provided so as to divide the detecting surface into a plurality of sections. When the bright spot image is moved across an auxiliary output terminal connected to an output terminal, the position x of the image is computed in accordance with the following formula:

$$x = (Ib - Ia)/(Ia + Ib)$$

Figure 1C:
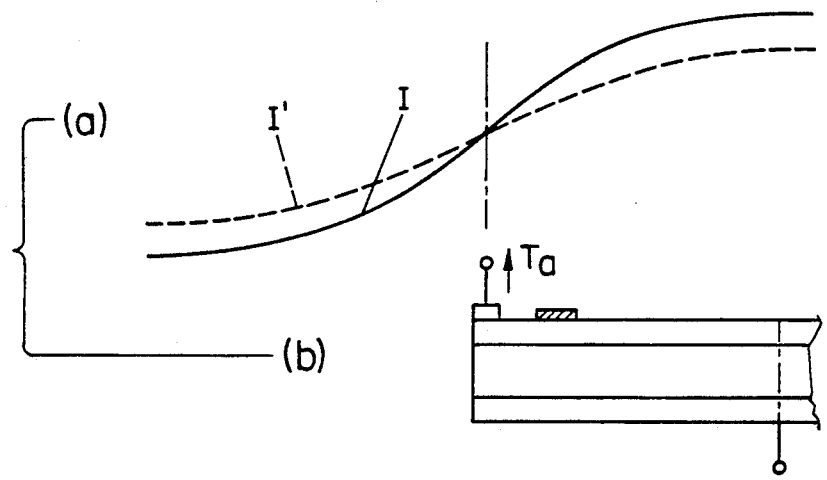
Figure 1D:
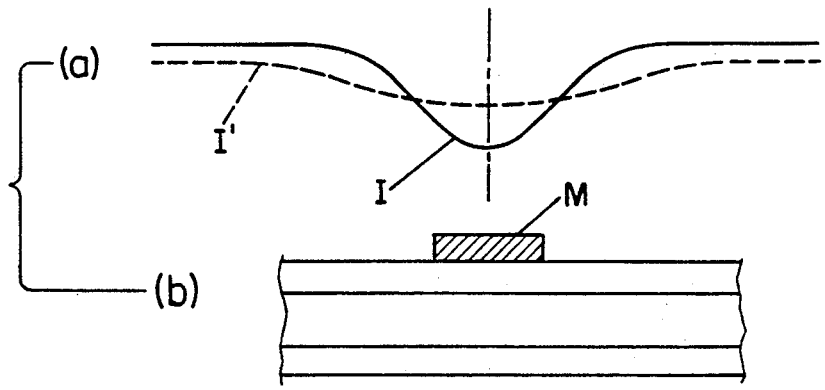
Figure 2B:
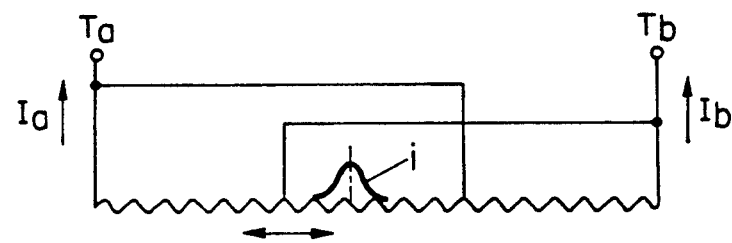
Figure 2C:
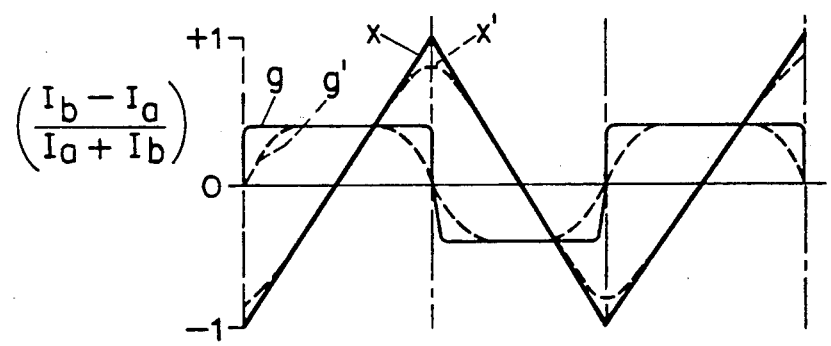
Figure 2D:
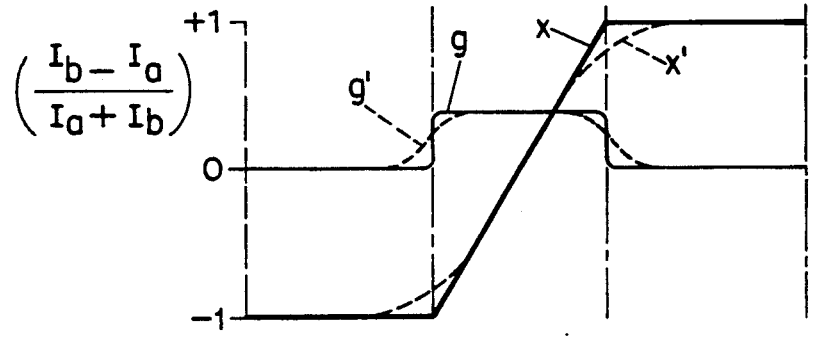

The computed value of the position x is shown in FIG. 1C. In FIG. 2A, a curve j represents the luminance distribution of the bright spot, while a curve i in FIG. 2B shows the distribution of density of the photoelectric current corresponding to the luminance distribution j. The output value x shown by the solid-line curve in FIG. 2C is rounded to a broken-line curve x' when the bright spot has a sufficiently small size and the image of this spot has a certain area. Curves g and g' in FIG. 1C show values obtained by differentiation of the curves x and x'. It will be seen that the smaller the bright soot image, i.e., the better the focusing state, the greater the gradient of the computed value of the light position at the output terminal across which the bright spot image is moved. At the same time, the computed light position at this output terminal becomes greater (or smaller). It is therefore possible to know the condition of focusing by measuring the computed position signal at the auxiliary output terminal across which the bright spot image is moved. Consequently, the imaging optical system can be adjusted for a better state of focusing by setting the same such that the greatest gradient of change in the computed image position value is obtained or such that the value of the computed image position is maximized or minimized. Referring to FIG. 2A, auxiliary output terminals $T_1$ and $T_2$ are connected to the output terminal Ta, while the auxiliary output terminals $T_3$ and $T_4$ are connected to the output terminal Tb. In this case, the computed position signal varies in a manner shown in FIG. 2D when the bright spot image is moved across the borders formed by the auxiliary output terminals $T_2$ and $T_3$. When the degree of defocus is large, large droops of the computed position curve are formed at the borders as shown by the broken-line curve in FIG. 2D. It is therefore possible to know the state of focusing on the PSD surface by measuring the gradient (g, g') of the computed position value at the borders.

According to the invention, a relative movement is caused between the bright spot image and the PSD such that the bright spot image moves across an light-insensitive or nonsensitive zone on the PSD surface or across a border between sections of the PSD surface defined by detecting terminals. This relative movement can be effected by a suitable measure, such as a movement of the target position, movement of the PSD or a movement of the optical system.

What is claimed is:

1. A method of monitoring the state of focusing of an image on a semiconductor image position sensitive device of the type having a photosensitive layer having a detection surface, a resistance layer provided on said photosensitive layer and output terminals provided on said resistance layer, said method comprising:

moving a bright spot image across a border between a light-insensitive or non-sensitive zone formed on said detection surface of said position sensitive device and a light-sensitive zone of said detection surface of said position sensitive device; and detecting the rate of change in the level of an output signal obtained when said bright spot image moves across said border, whereby the state of focusing of said bright spot image is detected.

2. A method according to claim 1, wherein said semiconductor image position sensitive device is of a multiple output terminal type having a plurality of auxiliary terminals arranged between output terminals disposed on opposite ends of said detection surface, and each of said auxiliary output terminals functions as said light-insensitive or non-sensitive zone.

* * * * *